(12) United States Patent
Dewey et al.

(10) Patent No.: US 11,398,560 B2
(45) Date of Patent: Jul. 26, 2022

(54) CONTACT ELECTRODES AND DIELECTRIC STRUCTURES FOR THIN FILM TRANSISTORS

(71) Applicant: Intel Corporation, Santa Clara, CA (US)

(72) Inventors: Gilbert Dewey, Beaveton, OR (US); Van H. Le, Portland, OR (US); Abhishek Sharma, Hillsboro, OR (US); Jack T. Kavalieros, Portland, OR (US); Sean Ma, Portland, OR (US); Seung Hoon Sung, Portland, OR (US); Nazila Haratipour, Hillsboro, OR (US); Tahir Ghani, Portland, OR (US); Justin Weber, Portland, OR (US); Shriram Shivaraman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 791 days.

(21) Appl. No.: 16/143,326

(22) Filed: Sep. 26, 2018

(65) Prior Publication Data
US 2020/0098887 A1 Mar. 26, 2020

(51) Int. Cl.
*H01L 29/51* (2006.01)
*H01L 29/786* (2006.01)
(Continued)

(52) U.S. Cl.
CPC .......... *H01L 29/518* (2013.01); *H01L 27/088* (2013.01); *H01L 27/108* (2013.01);
(Continued)

(58) Field of Classification Search
CPC ... H01L 29/518; H01L 27/088; H01L 27/108; H01L 29/41; H01L 29/41733;
(Continued)

(56) References Cited

U.S. PATENT DOCUMENTS 6,376,270 B1 * 4/2002 Gu .................... G02F 1/136227
257/E21.414
10,096,721 B2 * 10/2018 Yamazaki ........... H01L 29/7869
(Continued)

*Primary Examiner* — Shouxiang Hu
(74) *Attorney, Agent, or Firm* — Schwabe, Williamson & Wyatt, P.C.

(57) ABSTRACT

Embodiments herein describe techniques for a transistor above the substrate. The transistor includes a first gate dielectric layer with a first gate dielectric material above a gate electrode, and a second dielectric layer with a second dielectric material above a portion of the first gate dielectric layer. A first portion of a channel layer overlaps with only the first gate dielectric layer, while a second portion of the channel layer overlaps with the first gate dielectric layer and the second dielectric layer. A first portion of a contact electrode overlaps with the first portion of the channel layer, and overlaps with only the first gate dielectric layer, while a second portion of the contact electrode overlaps with the second portion of the channel layer, and overlaps with the first gate dielectric layer and the second dielectric layer. Other embodiments may be described and/or claimed.

17 Claims, 8 Drawing Sheets

(51) Int. Cl.
*H01L 29/66* (2006.01)
*H01L 29/49* (2006.01)
*H01L 29/417* (2006.01)
*H01L 27/088* (2006.01)
*H01L 27/108* (2006.01)
*H01L 29/41* (2006.01)

(52) U.S. Cl.
CPC ........ *H01L 29/41* (2013.01); *H01L 29/41733* (2013.01); *H01L 29/4908* (2013.01); *H01L 29/51* (2013.01); *H01L 29/66742* (2013.01); *H01L 29/786* (2013.01); *H01L 29/7869* (2013.01); *H01L 29/78642* (2013.01); *H01L 29/78696* (2013.01)

(58) Field of Classification Search
CPC ................. H01L 29/4908; H01L 29/51; H01L 29/66742; H01L 29/786; H01L 29/78642; H01L 29/7869; H01L 29/78696; H01L 27/0688; H01L 27/1248; H01L 29/0653
See application file for complete search history.

(56) References Cited

U.S. PATENT DOCUMENTS

2013/0256653 A1* 10/2013 Ahn .................. H01L 29/78696
257/E21.462
2020/0144393 A1* 5/2020 Kitano ................ H01L 29/1075

* cited by examiner

CONTACT ELECTRODES AND DIELECTRIC STRUCTURES FOR THIN FILM TRANSISTORS

FIELD

Embodiments of the present disclosure generally relate to the field of integrated circuits, and more particularly, to transistors.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs vertically in the backend, while leaving the silicon substrate areas for high-speed transistors. TFTs hold great potential for large area and flexible electronics, e.g., displays. Other applications of TFTs may include memory arrays. However, some TFTs may have large parasitic capacitances.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
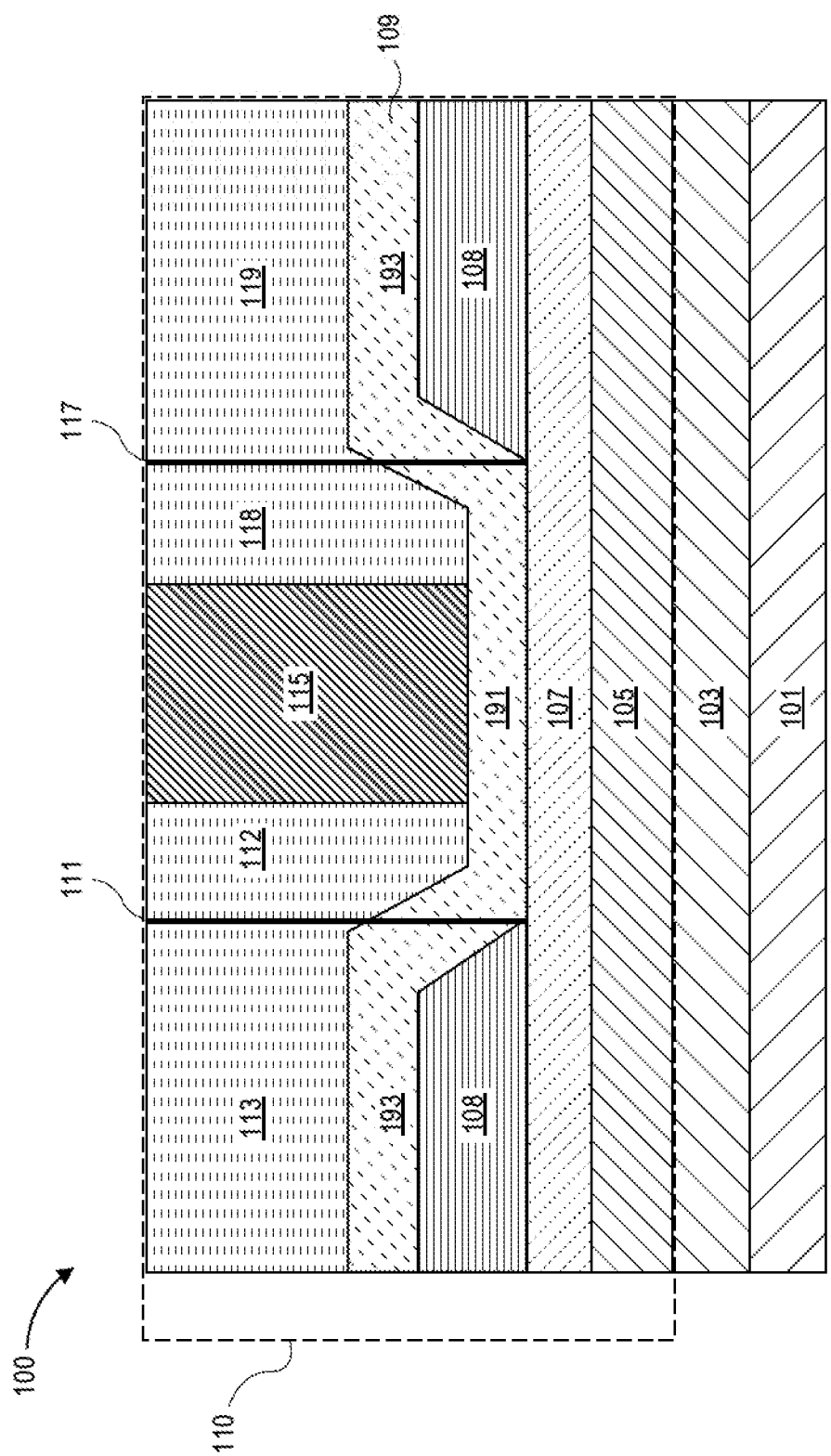
FIG. 1 schematically illustrates a diagram of a thin film transistor (TFT) including a contact electrode having multiple portions over one or more dielectric layers, in accordance with some embodiments.

Thin-film transistors (TFT) have emerged as an attractive option to fuel Moore's law by integrating TFTs in the backend. TFTs may be fabricated in various architectures, e.g., a back-gated or bottom gate architecture, or a top-gated architecture. A TFT in a top-gated architecture may be fabricated by a process different from a process for a TFT in a back-gated architecture, and may not be applicable to some applications. For example, a TFT in a back-gated architecture may have more benefit for some memory applications. However, a TFT in a back-gated architecture may have a large parasitic capacitance caused by a gate electrode overlapping with a source electrode or a drain electrode. The large parasitic capacitance problem for a TFT in a back-gated architecture may become worse with the scaling options. Some techniques may reduce the parasitic capacitance by reducing the source area or the drain area, which may lead to increased access resistances and performance loss for the TFT in a back-gated architecture.

Embodiments herein may include TFTs having a contact electrode having multiple portions over one or more dielectric layers. A contact electrode includes a first portion and a second portion above a channel layer. The first portion of the contact electrode overlaps with only a first gate dielectric layer, while the second portion of the contact electrode overlaps with the first gate dielectric layer and a second dielectric layer. The second dielectric layer overlapping with the second portion of the contact electrode may not affect the access resistances while reducing the overlap capacitances for a TFT in a back-gated architecture. Hence, such a TFT in a back-gated architecture may result in a faster and more scalable device.

Embodiments herein may present a semiconductor device including a substrate and a transistor above the substrate. The transistor includes a gate electrode above the substrate, a first gate dielectric layer above the gate electrode, and a second dielectric layer above a portion of the first gate dielectric layer. The first gate dielectric layer includes a first gate dielectric material, and the second dielectric layer includes a second dielectric material. A channel layer is above the gate electrode and includes a first portion and a second portion. The first portion of the channel layer overlaps with only the first gate dielectric layer, while the second portion of the channel layer overlaps with the first gate dielectric layer and the second dielectric layer. A contact electrode is above the channel layer and includes a first portion and a second portion. The first portion of the contact electrode overlaps with the first portion of the channel layer, and overlaps with only the first gate dielectric layer, while the second portion of the contact electrode overlaps with the second portion of the channel layer, and overlaps with the first gate dielectric layer and the second dielectric layer.

In embodiments, a method for forming a TFT includes forming a gate electrode above a substrate, forming a first gate dielectric layer above the gate electrode, and forming a second dielectric layer above a portion of the first gate dielectric layer. The first gate dielectric layer includes a first gate dielectric material, and the second dielectric layer includes a second dielectric material. The method further includes forming a channel layer conformally covering the first gate dielectric layer and the second dielectric layer. The channel layer includes a first portion and a second portion. In addition, the method includes forming a contact electrode above the channel layer, where the contact electrode includes a first portion and a second portion. The first portion of the contact electrode overlaps with only the first gate dielectric layer, while the second portion of the contact electrode overlaps with the first gate dielectric layer and the second dielectric layer.

Embodiments herein may present a computing device, which may include a circuit board, and a memory device coupled to the circuit board and including a memory array. In more detail, the memory array may include a plurality of memory cells. A memory cell of the plurality of memory cells may include a transistor and a storage cell. The transistor in the memory cell may include a source electrode coupled to a bit line of the memory array, a gate electrode above a substrate and coupled to a word line of the memory array, and a drain electrode coupled to a first electrode of the storage cell. Furthermore, the transistor includes a first gate dielectric layer above the gate electrode, and a second dielectric layer above a portion of the first gate dielectric layer. The first gate dielectric layer includes a first gate dielectric material, and the second dielectric layer includes a second dielectric material. A channel layer is above the gate electrode and includes a first portion and a second portion. The first portion of the channel layer overlaps with only the first gate dielectric layer, while the second portion of the channel layer overlaps with the first gate dielectric layer and the second dielectric layer. In addition, the source electrode is above the channel layer and includes a first portion and a second portion. The first portion of the source electrode overlaps with the first portion of the channel layer, and overlaps with only the first gate dielectric layer, while the second portion of the source electrode overlaps with the second portion of the channel layer, and overlaps with the first gate dielectric layer and the second dielectric layer. Furthermore, the storage cell may have a second electrode coupled to a source line of the memory array.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, zinc oxide or other combinations of group III-V, II-VI, group IV, or semiconducting oxide materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates a diagram of a TFT 110 including a contact electrode 111 having multiple portions, e.g., a first portion 112 and a second portion 113, over one or more dielectric layers, e.g., a gate dielectric layer 107, and a dielectric layer 108, in accordance with some embodiments. For clarity, features of the TFT 110, the contact electrode 111 with multiple portions, the gate dielectric layer 107, and the dielectric layer 108 may be described below as examples for understanding an example TFT including a contact electrode having multiple portions over one or more dielectric layers. It is to be understood that there may be more or fewer components within a TFT, a contact electrode having multiple portions, and dielectric layers. Further, it is to be understood that one or more of the components within a TFT, a contact electrode having multiple portions, and dielectric layers, may include additional and/or varying features from the description below, and may include any device that one having ordinary skill in the art would consider and/or refer to as a TFT, a contact electrode having multiple portions, and dielectric layers.

In embodiments, an IC 100 includes a substrate 101, an ILD layer 103 above the substrate 101, and the TFT 110 above the substrate 101 and the ILD layer 103. The TFT 110 includes a gate electrode 105 above the substrate 101, the gate dielectric layer 107, the dielectric layer 108, a channel layer 109, the contact electrode 111, and a contact electrode 117. The contact electrode 111 and the contact electrode 117 are in contact with the channel layer 109. The contact electrode 111 or the contact electrode 117 may be a drain electrode or a source electrode. A passivation layer 115 is adjacent to the channel layer 109, between the contact electrode 111 and the contact electrode 117. The gate electrode 105, the gate dielectric layer 107, the dielectric layer 108, the channel layer 109, the contact electrode 111, and the contact electrode 117 may be within an ILD layer. The channel layer 109 is above the gate electrode 105, the gate dielectric layer 107, and the dielectric layer 108.

In embodiments, the gate dielectric layer 107 includes a first gate dielectric material, and the dielectric layer 108 includes a second dielectric material. The dielectric layer 108 is above a portion of the gate dielectric layer 107. As shown in FIG. 1, the dielectric layer 108 has two disjoint portions, one adjacent to a source area of the channel layer 109, and another adjacent to a drain area of the channel layer 109. A portion of the dielectric layer 108 may be of a trapezoid shape. In some other embodiment, a portion of the dielectric layer 108 may be of a shape selected from the group consisting of rectangular shape, a square shape, an oval shape, a circular shape, a triangular shape, a staircase shape, a trapezoid shape, and a polygon shape, e.g., as shown in FIGS. 2(*a*)-2(*b*).

In some embodiments, the first gate dielectric material in the gate dielectric layer 107 may be a high-k material, and the second dielectric material in the dielectric layer 108 may be a low-k material. For example, the first gate dielectric material may have a dielectric constant in a range of [8, 30], while the second dielectric material may have a dielectric constant in a range of [2, 8). In more details, the first gate dielectric material may be a high-k material selected from silicon and oxygen; silicon and nitrogen; yttrium and oxygen; silicon, oxygen, and nitrogen; aluminum and oxygen; hafnium and oxygen; tantalum and oxygen; or titanium and oxygen. On the other hand, the second dielectric material may be a low-k material selected from fluorine-doped silicon dioxide, carbon-doped silicon dioxide, silicon nitride, silicon oxynitride, silicon carbon oxynitride, porous silicon dioxide, porous carbon-doped silicon dioxide, or organic polymeric dielectrics.

In embodiments, the channel layer 109 includes a first portion 191, and a second portion 193, both above the gate electrode 105. The first portion 191 of the channel layer 109 overlaps with only the gate dielectric layer 107, and the second portion 193 of the channel layer 109 overlaps with the gate dielectric layer 107 and the dielectric layer 108.

In embodiments, the contact electrode 111 includes the first portion 112 and the second portion 113 above the channel layer 109. The first portion 112 of the contact electrode 111 may overlap with the first portion 191 of the channel layer 109, and overlap with only the gate dielectric layer 107. On the other hand, the second portion 113 of the contact electrode 111 overlaps with the second portion 193 of the channel layer 109, and overlaps with the gate dielectric layer 107 and the dielectric layer 108.

In embodiments, the contact electrode 117 may be similar to the contact electrode 111. The contact electrode 117 or the contact electrode 111 may be a source electrode or a drain electrode. A source electrode and a drain electrode may be used interchangeably. In detail, the contact electrode 117 includes a first portion 118 and a second portion 119 above the channel layer 109. The first portion 118 of the contact electrode 117 may overlap with the first portion 191 of the channel layer 109, and overlap with only the gate dielectric layer 107. On the other hand, the second portion 119 of the contact electrode 117 overlaps with the second portion 193 of the channel layer 109, and overlaps with the gate dielectric layer 107 and the dielectric layer 108.

The use of the dielectric layer 108 under the second portion 113 of the contact electrode 111, and the use of the dielectric layer 108 under the second portion 119 of the contact electrode 117 may increase the contact area of the source electrode or the drain electrode, reducing the overlap capacitances for the TFT 110.

In embodiments, the channel layer 109 may be a n-type doped channel or a p-type doped channel. The channel layer 109 may include a material such as: $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide.

In embodiments, the substrate 101 may be a silicon substrate, a glass substrate, such as soda lime glass or borosilicate glass, a metal substrate, a plastic substrate, or another suitable substrate. Other dielectric layer or other devices may be formed on the substrate 101, not shown for clarity.

In embodiments, the ILD layer 103 may include silicon dioxide ($SiO_2$), carbon doped oxide (CDO), silicon nitride, perfluorocyclobutane, polytetrafluoroethylene, fluorinated silicate glass (FSG), organic polymer, siloxane, a porous dielectric material, or organosilicate glass. In some embodiments, the ILD layer 103 may include some low-k dielectric materials. Suitable dielectric materials may include carbon-doped silicon dioxide materials, organic polymeric thermoset materials, silicon oxycarbide; SiCOH dielectrics; fluorine doped silicon oxide; spin-on glasses, silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric material.

In embodiments, the gate electrode 105, the contact electrode 111, or the contact electrode 117, may include a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Figure 2A:
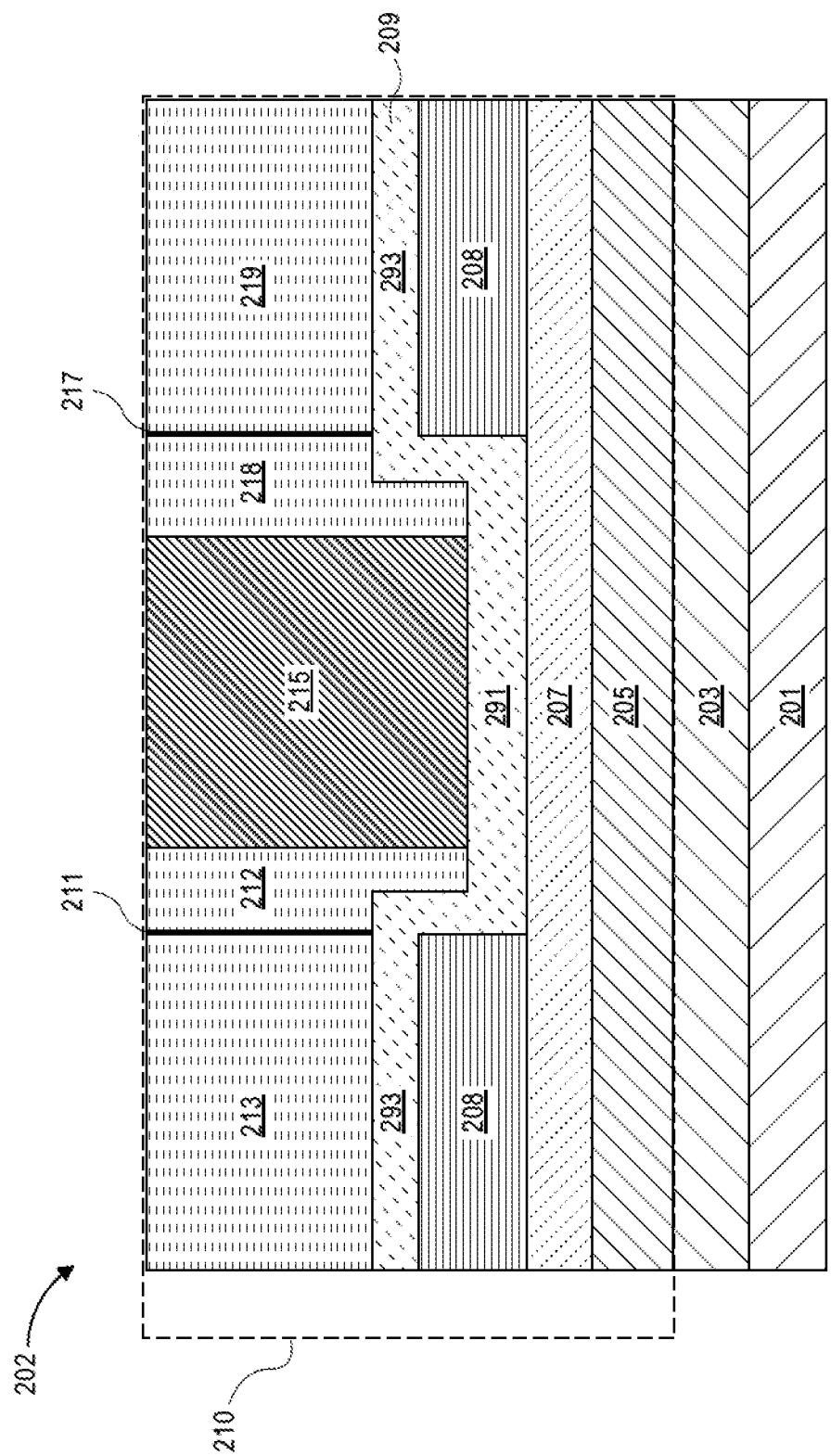
FIGS. 2(*a*)-2(*b*) schematically illustrate diagrams of a TFT including a contact electrode having multiple portions over one or more dielectric layers, in accordance with some embodiments.
Figure 2B:
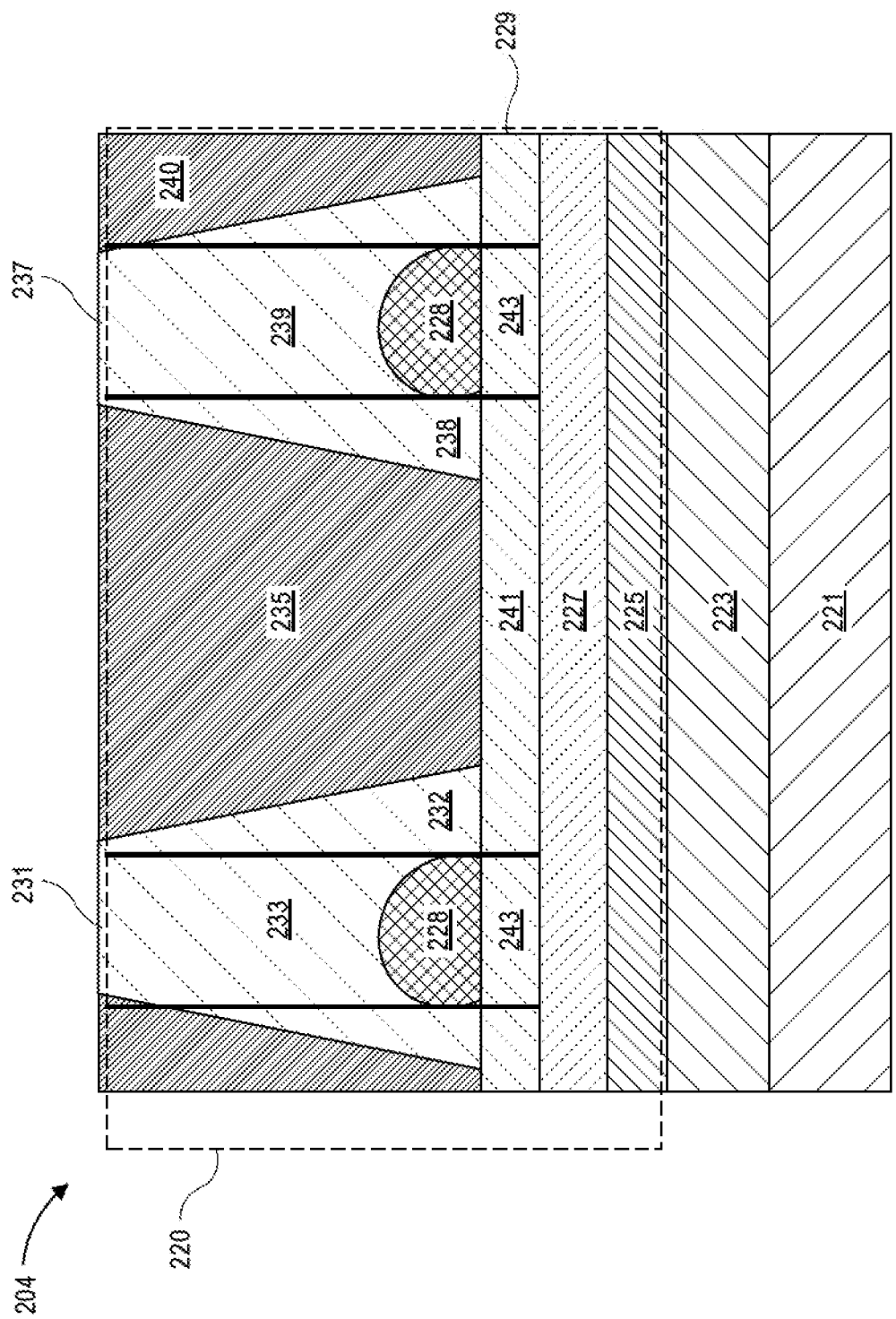

FIGS. 2(a)-2(b) schematically illustrate diagrams of a TFT, e.g., a TFT 210 or a TFT 220, including a contact electrode having multiple portions over one or more dielectric layers, in accordance with some embodiments. The TFT 210 and the TFT 220 may be similar to the TFT 110 as shown in FIG. 1.

In embodiments, as shown in FIG. 2(a), an IC 202 includes a substrate 201, an ILD layer 203 above the substrate 201, and the TFT 210 above the substrate 201 and the ILD layer 203. The TFT 210 includes a gate electrode 205 above the substrate 201, a gate dielectric layer 207, a dielectric layer 208, a channel layer 209, a contact electrode 211, and a contact electrode 217. The contact electrode 211 and the contact electrode 217 are in contact with the channel layer 209. The contact electrode 211 or the contact electrode 217 may be a drain electrode or a source electrode. A passivation layer 215 is adjacent to the channel layer 209, between the contact electrode 211 and the contact electrode 217. The gate electrode 205, the gate dielectric layer 207, the dielectric layer 208, the channel layer 209, the contact electrode 211, and the contact electrode 217 may be within an ILD layer. The channel layer 209 is above the gate electrode 205, the gate dielectric layer 207, and the dielectric layer 208. The dielectric layer 208 is above the gate dielectric layer 207.

In embodiments, the gate dielectric layer 207 includes a first gate dielectric material, and the dielectric layer 208 includes a second dielectric material. The dielectric layer 208 is above a portion of the gate dielectric layer 207. A portion of the dielectric layer 208 may be of a rectangular shape. In some other embodiment, a portion of the dielectric layer 208 may be of a shape selected from the group consisting of a square shape, an oval shape, a circular shape, a triangular shape, a staircase shape, a trapezoid shape, and a polygon shape. In some embodiments, the first gate dielectric material in the gate dielectric layer 207 may be a high-k material, and the second dielectric material in the dielectric layer 208 may be a low-k material.

In embodiments, the channel layer 209 includes a first portion 291, and a second portion 293, both above the gate electrode 205. The first portion 291 of the channel layer 209 overlaps with only the gate dielectric layer 207, and the second portion 293 of the channel layer 209 overlaps with the gate dielectric layer 207 and the dielectric layer 208.

In embodiments, the contact electrode 211 includes a first portion 212 and a second portion 213 above the channel layer 209. The first portion 212 of the contact electrode 211 may overlap with the first portion 291 of the channel layer 209, and overlap with only the gate dielectric layer 207. On the other hand, the second portion 213 of the contact electrode 211 overlaps with the second portion 293 of the channel layer 209, and overlaps with the gate dielectric layer 207 and the dielectric layer 208.

In embodiments, the contact electrode 217 includes a first portion 218 and a second portion 219 above the channel layer 209. The first portion 218 of the contact electrode 217 may overlap with the first portion 291 of the channel layer 209, and overlap with only the gate dielectric layer 207. On the other hand, the second portion 219 of the contact electrode 217 overlaps with the second portion 293 of the channel layer 209, and overlaps with the gate dielectric layer 207 and the dielectric layer 208.

In embodiments, as shown in FIG. 2(b), an IC 204 includes a substrate 221, an ILD layer 223 above the substrate 221, and the TFT 220 above the substrate 221 and the ILD layer 223. The TFT 220 includes a gate electrode 225 above the substrate 221, a gate dielectric layer 227, a dielectric layer 228, a channel layer 229, a contact electrode 231, and a contact electrode 237. The contact electrode 231 and the contact electrode 237 are in contact with the channel layer 229. The contact electrode 231 or the contact electrode 237 may be a drain electrode or a source electrode. A passivation layer 235 is adjacent to the channel layer 229, between the contact electrode 231 and the contact electrode 237. The gate electrode 225, the gate dielectric layer 227, the dielectric layer 228, the channel layer 229, the contact electrode 231, and the contact electrode 237 may be within an ILD layer 240. The channel layer 229 is above the gate electrode 225, and the gate dielectric layer 227, while the dielectric layer 228 is above the channel layer 229.

In embodiments, the gate dielectric layer 227 includes a first gate dielectric material, and the dielectric layer 228 includes a second dielectric material. The dielectric layer 228 is above a portion of the gate dielectric layer 227. A portion of the dielectric layer 228 may be of a half-circular shape. In some other embodiment, a portion of the dielectric layer 228 may be of a shape selected from the group consisting of a square shape, an oval shape, a circular shape, a triangular shape, a staircase shape, a trapezoid shape, and a polygon shape. In some embodiments, the first gate dielectric material in the gate dielectric layer 207 may be a high-k material, and the second dielectric material in the dielectric layer 208 may be a low-k material.

In embodiments, the channel layer 229 includes a first portion 241, and a second portion 243, both above the gate electrode 225. The first portion 241 of the channel layer 229 overlaps with only the gate dielectric layer 227, and the second portion 243 of the channel layer 229 overlaps with the gate dielectric layer 227 and the dielectric layer 228.

In embodiments, the contact electrode 231 includes a first portion 232 and a second portion 233 above the channel layer 209. The first portion 232 of the contact electrode 231 may overlap with the first portion 241 of the channel layer 229, and overlap with only the gate dielectric layer 227. On the other hand, the second portion 233 of the contact electrode 231 overlaps with the second portion 243 of the channel layer 229, and overlaps with the gate dielectric layer 227 and the dielectric layer 228.

In embodiments, the contact electrode 237 includes a first portion 238 and a second portion 239 above the channel layer 229. The first portion 238 of the contact electrode 237 may overlap with the first portion 241 of the channel layer 229, and overlap with only the gate dielectric layer 227. On the other hand, the second portion 239 of the contact electrode 237 overlaps with the second portion 243 of the channel layer 229, and overlaps with the gate dielectric layer 227 and the dielectric layer 228.

Figure 3:
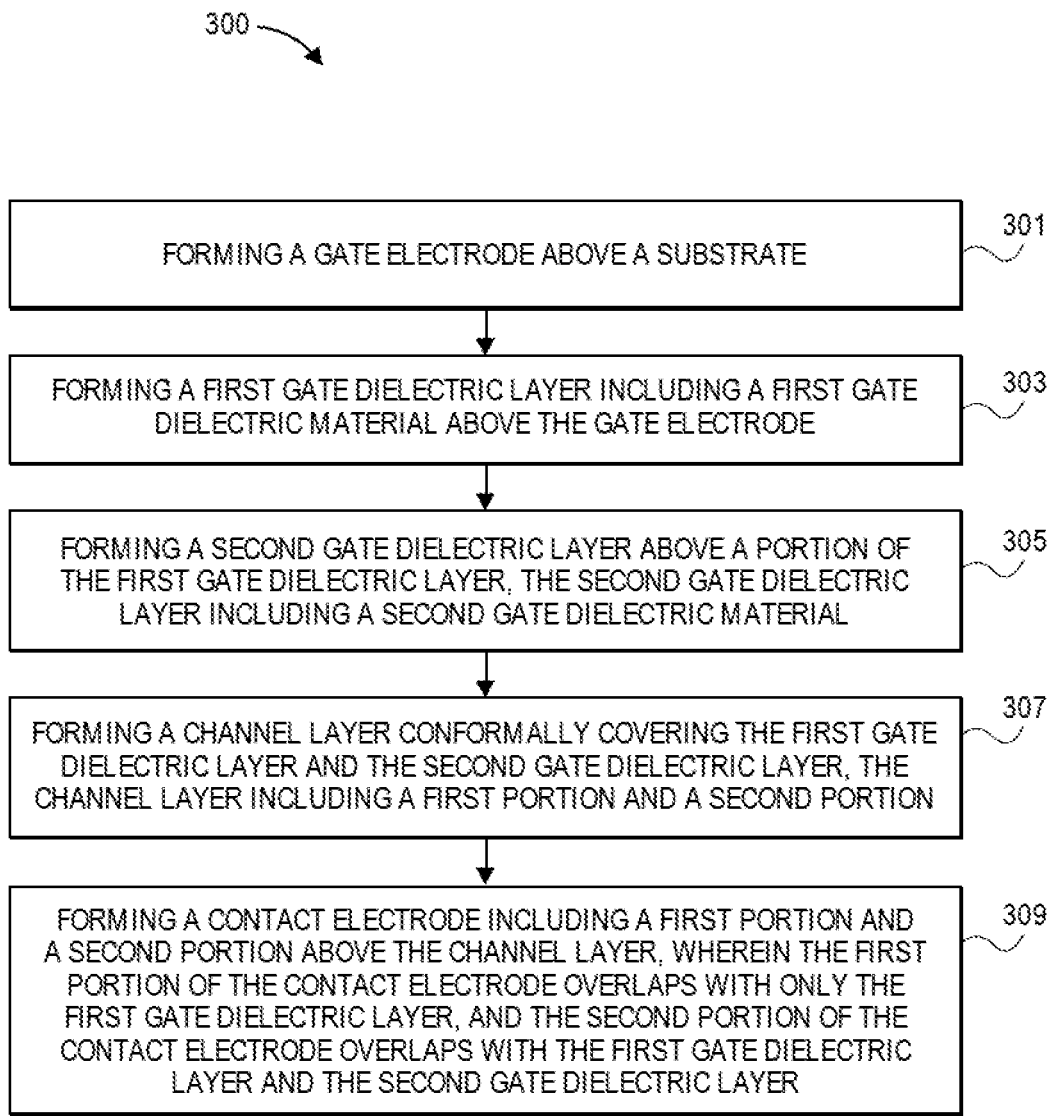
FIG. 3 illustrates a diagram of a process for forming a TFT including a contact electrode having multiple portions over one or more dielectric layers, in accordance with some embodiments.

FIG. 3 illustrates a diagram of a process 300 for forming a TFT including a contact electrode having multiple portions over one or more dielectric layers, in accordance with some embodiments. In embodiments, the process 300 may be applied to form the TFT 110 as shown in FIG. 1, or the TFT 210 as shown in FIG. 2(a).

At block 301, the process 300 may include forming a gate electrode above a substrate. For example, the process 300 may include forming the gate electrode 105 above the substrate 101.

At block 303, the process 300 may include forming a first gate dielectric layer including a first gate dielectric material above the gate electrode. For example, the process 300 may include forming the gate dielectric layer 107 including a first gate dielectric material above the gate electrode 105.

At block 305, the process 300 may include forming a second dielectric layer above a portion of the first gate dielectric layer, the second dielectric layer including a second dielectric material. For example, the process 300 may include forming the dielectric layer 108 above a portion of the gate dielectric layer 107, the dielectric layer 108 including a second dielectric material.

At block 307, the process 300 may include forming a channel layer conformally covering the first gate dielectric layer and the second dielectric layer, the channel layer including a first portion and a second portion. For example, the process 300 may include forming the channel layer 109 conformally covering the gate dielectric layer 107 and the dielectric layer 108. The channel layer 109 includes the first portion 191 and the second portion 193 above the gate electrode 105, where the first portion 191 of the channel layer 109 overlaps with only the gate dielectric layer 107, and the second portion 193 of the channel layer 109 overlaps with the gate dielectric layer 107 and the dielectric layer 108.

At block 309, the process 300 may include forming a contact electrode including a first portion and a second portion above the channel layer, wherein the first portion of the contact electrode overlaps with only the first gate dielectric layer, and the second portion of the contact electrode overlaps with the first gate dielectric layer and the second dielectric layer. For example, the process 300 may include forming the contact electrode 111 including the first portion 112 and the second portion 113 above the channel layer 109, where the first portion 112 of the contact electrode 111 overlaps with the first portion 191 of the channel layer 109, and overlaps with only the gate dielectric layer 107, and the second portion 113 of the contact electrode 111 overlaps with the second portion 193 of the channel layer 109, and overlaps with the gate dielectric layer 107 and the dielectric layer 108.

In addition, the process 300 may include additional operations to form other layers, e.g., ILD layers, encapsulation layers, insulation layers, not shown.

Figure 4:
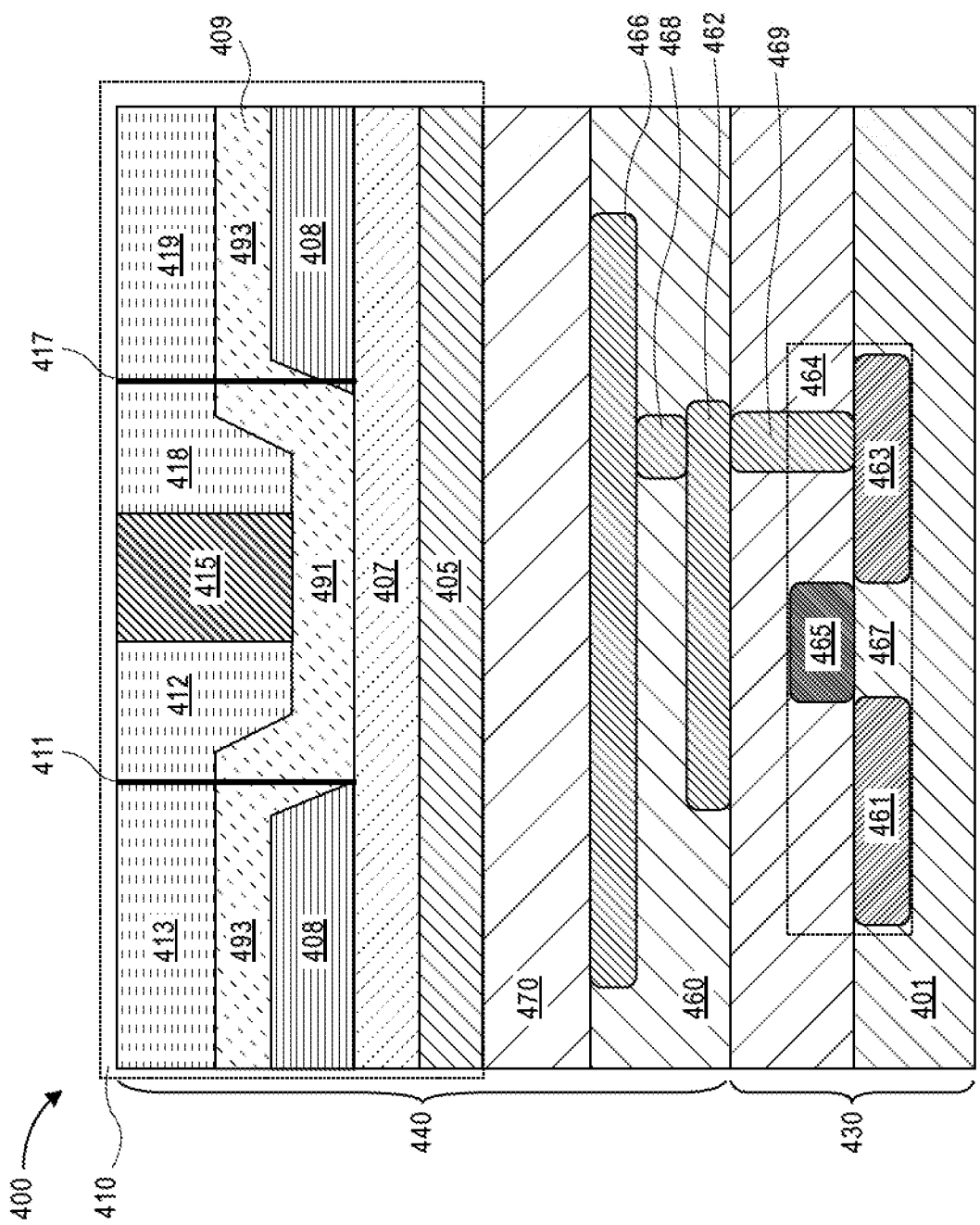
FIG. 4 schematically illustrates a diagram of TFT including a contact electrode having multiple portions over one or more dielectric layers and formed in back-end-of-line (BEOL) on a substrate, in accordance with some embodiments.

FIG. 4 schematically illustrates a diagram of TFT 410 including a contact electrode having multiple portions over one or more dielectric layers and formed in back-end-of-line (BEOL) on a substrate, in accordance with some embodiments. The TFT 410 may be an example of the TFT 110 as shown in FIG. 1, the TFT 210 as shown in FIG. 2(*a*), or the TFT 220 as shown in FIG. 2(*b*). Various layers in the TFT 410 may be similar to corresponding layers in the TFT 110 as shown in FIG. 1, the TFT 210 as shown in FIG. 2(*a*), or the TFT 220 as shown in FIG. 2(*b*).

In embodiments, an IC 400 includes a substrate 401, and the TFT 410 above the substrate 401. The TFT 410 includes a gate electrode 405 above the substrate 401, a gate dielectric layer 407, a dielectric layer 408, a channel layer 409, a contact electrode 411, and a contact electrode 417. The contact electrode 411 and the contact electrode 417 are in contact with the channel layer 409. The contact electrode 411 or the contact electrode 417 may be a drain electrode or a source electrode. A passivation layer 415 is adjacent to the channel layer 409, between the contact electrode 411 and the contact electrode 417. The gate electrode 405, the gate dielectric layer 407, the dielectric layer 408, the channel layer 409, the contact electrode 411, and the contact electrode 417 may be within an ILD layer. The channel layer 409 is above the gate electrode 405, the gate dielectric layer 407, and the dielectric layer 408. The dielectric layer 408 is above the gate dielectric layer 407.

In embodiments, the gate dielectric layer 407 includes a first gate dielectric material, and the dielectric layer 408 includes a second dielectric material. The dielectric layer 408 is above a portion of the gate dielectric layer 407. In some embodiments, the first gate dielectric material in the gate dielectric layer 407 may be a high-k material, and the second dielectric material in the dielectric layer 408 may be a low-k material.

In embodiments, the channel layer 409 includes a first portion 491, and a second portion 493, both above the gate electrode 405. The first portion 491 of the channel layer 409 overlaps with only the gate dielectric layer 407, and the second portion 493 of the channel layer 409 overlaps with the gate dielectric layer 407 and the dielectric layer 408.

In embodiments, the contact electrode 411 includes a first portion 412 and a second portion 413 above the channel layer 409. The first portion 412 of the contact electrode 411 may overlap with the first portion 491 of the channel layer 409, and overlap with only the gate dielectric layer 407. On the other hand, the second portion 413 of the contact electrode 411 overlaps with the second portion 493 of the channel layer 409, and overlaps with the gate dielectric layer 407 and the dielectric layer 408.

In embodiments, the contact electrode 417 includes a first portion 418 and a second portion 419 above the channel layer 409. The first portion 418 of the contact electrode 417 may overlap with the first portion 491 of the channel layer 409, and overlap with only the gate dielectric layer 407. On the other hand, the second portion 419 of the contact electrode 417 overlaps with the second portion 493 of the channel layer 409, and overlaps with the gate dielectric layer 407 and the dielectric layer 408.

In embodiments, the vertical TFT 410 may be formed at the BEOL 440. In addition to the TFT 410, the BEOL 440 may further include a dielectric layer 460 and a dielectric layer 470. One or more vias, e.g., a via 468, may be connected to one or more interconnect, e.g., an interconnect 466, and an interconnect 462 within the dielectric layer 460. In embodiments, the interconnect 466 and the interconnect 462 may be of different metal layers at the BEOL 440. The dielectric layer 460 is shown for example only. Although not shown by FIG. 4, in various embodiments there may be multiple dielectric layers included in the BEOL 440.

In embodiments, the BEOL 440 may be formed on the front-end-of-line (FEOL) 430. The FEOL 430 may include the substrate 401. In addition, the FEOL 430 may include other devices, e.g., a transistor 464. In embodiments, the transistor 464 may be a FEOL transistor, including a source 461, a drain 463, and a gate 465, with a channel 467 between the source 461 and the drain 463 under the gate 465. Furthermore, the transistor 464 may be coupled to interconnects, e.g., the interconnect 462, through a via 469.

Figure 5:
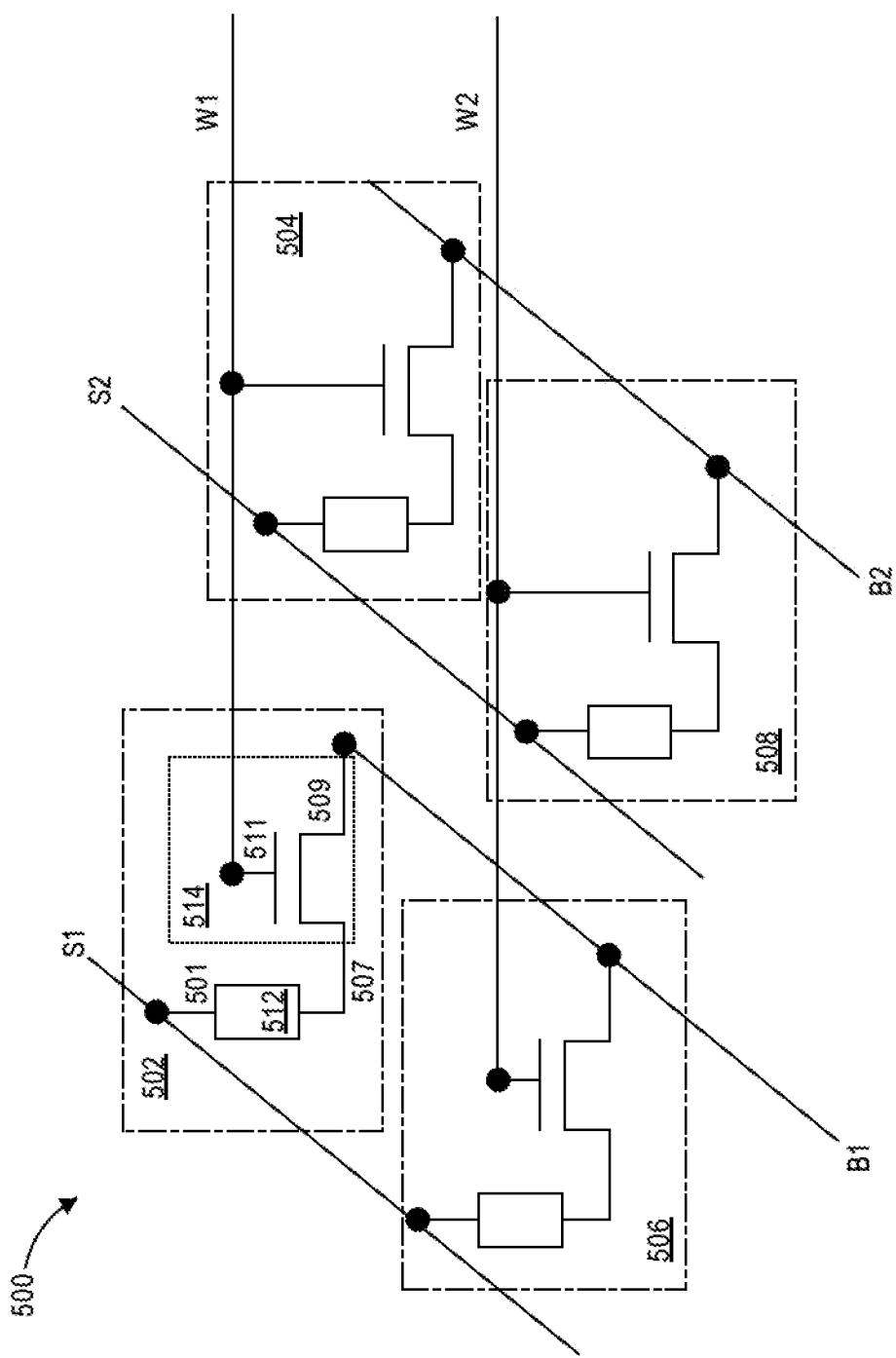
FIG. 5 schematically illustrates a memory array with multiple memory cells, where a TFT may be a selector of a memory cell, in accordance with some embodiments.

FIG. 5 schematically illustrates a memory array 500 with multiple memory cells (e.g., a memory cell 502, a memory cell 504, a memory cell 506, and a memory cell 508), where a TFT, e.g., a TFT 514, may be a selector of a memory cell, e.g., the memory cell 502, in accordance with various embodiments. In embodiments, the TFT 514 may be an example of the TFT 110 as shown in FIG. 1, the TFT 210 as shown in FIG. 2(*a*), the TFT 220 as shown in FIG. 2(*b*), or the TFT 410 in FIG. 4. The TFT 514 may include a gate electrode 511 coupled to a word line W1.

In embodiments, the multiple memory cells may be arranged in a number of rows and columns coupled by bit lines, e.g., bit line B1 and bit line B2, word lines, e.g., word line W1 and word line W2, and source lines, e.g., source line S1 and source line S2. The memory cell 502 may be coupled in series with the other memory cells of the same row, and may be coupled in parallel with the memory cells of the other rows. The memory array 500 may include any suitable number of one or more memory cells.

In embodiments, multiple memory cells, such as the memory cell 502, the memory cell 504, the memory cell 506, and the memory cell 508, may have a similar configuration. For example, the memory cell 502 may include the TFT 514 coupled to a storage cell 512 that may be a capacitor, which may be called a 1T1C configuration. The memory cell 502 may be controlled through multiple electrical connections to read from the memory cell, write to the memory cell, and/or perform other memory operations. In some embodiments, the storage cell 512 may be another type of storage device, e.g., a resistive random access memory (RRAM) cell.

The TFT 514 may be a selector for the memory cell 502. A word line W1 of the memory array 500 may be coupled to a gate electrode 511 of the TFT 514. When the word line W1 is active, the TFT 514 may select the storage cell 512. A source line S1 of the memory array 500 may be coupled to an electrode 501 of the storage cell 512, while another electrode 507 of the storage cell 512 may be shared with the TFT 514. In addition, a bit line B1 of the memory array 500 may be coupled to another electrode, e.g., an electrode 509 of the TFT 514. The shared electrode 507 may be a source electrode or a drain electrode of the TFT 514, while the electrode 509 may be a drain electrode or a source electrode of the TFT 514. A drain electrode and a source electrode may be used interchangeably herein. Additionally, a source line and a bit line may be used interchangeably herein.

In various embodiments, the memory cells and the transistors, e.g., the memory cell 502 and the TFT 514, included in the memory array 500 may be formed in BEOL, as shown in FIG. 4. For example, the TFT 514 may be illustrated as the vertical TFT 410 shown in FIG. 4 at the BEOL. Accordingly, the memory array 500 may be formed in higher metal layers, e.g., metal layer 3 and/or metal layer 4, of the integrated circuit above the active substrate region, and may not occupy the active substrate area that is occupied by conventional transistors or memory devices.

Figure 6:
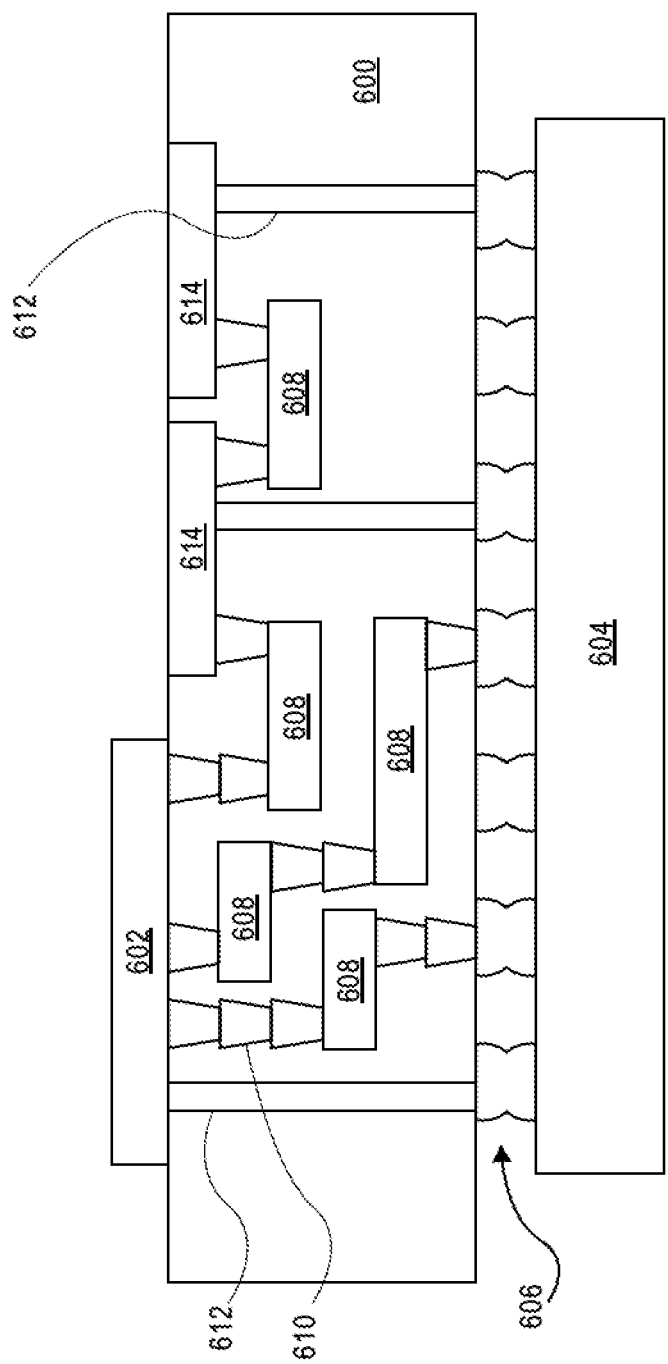
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 is an intervening substrate used to bridge a first substrate 602 to a second substrate 604. The first substrate 602 may be, for instance, a substrate support for a TFT, e.g., the TFT 110 as shown in FIG. 1, the TFT 210 as shown in FIG. 2(a), the TFT 220 as shown in FIG. 2(b), or the TFT 410 in FIG. 4. The second substrate 604 may be, for instance, a memory module, a computer motherboard, or another integrated circuit die. For example, the second substrate 604 may be a memory module including the memory array 500 as shown in FIG. 5. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
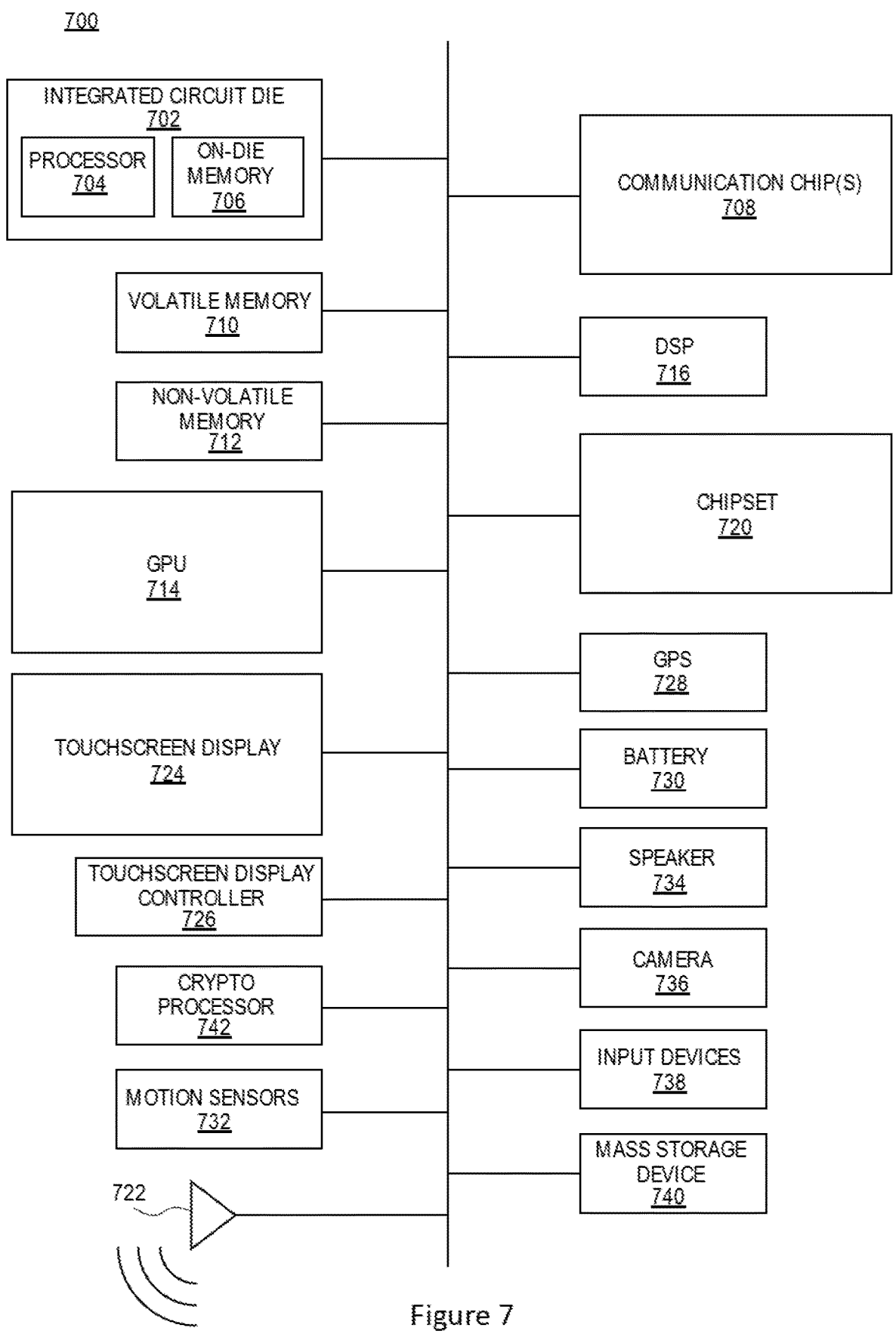
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. For example, the on-die memory 706 may include the TFT 110 as shown in FIG. 1, the TFT 210 as shown in FIG. 2(a), the TFT 220 as shown in FIG. 2(b), or the TFT 410 in FIG. 4, or a TFT formed according to the process 300 shown in FIG. 3.

In embodiments, the computing device 700 may include a display or a touchscreen display 724, and a touchscreen display controller 726. A display or the touchscreen display 724 may include a FPD, an AMOLED display, a TFT LCD, a micro light-emitting diode (μLED) display, or others. For example, the touchscreen display 724 may include the TFT 110 as shown in FIG. 1, the TFT 210 as shown in FIG. 2(a), the TFT 220 as shown in FIG. 2(b), or the TFT 410 in FIG. 4, or a TFT formed according to the process 300 shown in FIG. 3.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 730 or other power source, a power amplifier (not shown), a voltage regulator (not shown), a global positioning system (GPS) device 728, a compass, a motion coprocessor or sensors 732 (that may include an accelerometer, a gyroscope, and a compass), a microphone (not shown), a speaker 734, a camera 736, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as DRAM, that are formed in accordance with implementations of the current disclosure, e.g., the TFT 110 as shown in FIG. 1, the TFT 210 as shown in FIG. 2(*a*), the TFT 220 as shown in FIG. 2(*b*), or the TFT 410 in FIG. 4, or a TFT formed according to the process 300 shown in FIG. 3.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some Non-Limiting Examples are Provided Below.

Example 1 may include a semiconductor device, comprising: a substrate; a transistor above the substrate, wherein the transistor includes: a gate electrode above the substrate; a first gate dielectric layer including a first gate dielectric material above the gate electrode; a second dielectric layer above a portion of the first gate dielectric layer, the second dielectric layer including a second dielectric material; a channel layer including a first portion and a second portion above the gate electrode, wherein the first portion of the channel layer overlaps with only the first gate dielectric layer, and the second portion of the channel layer overlaps with the first gate dielectric layer and the second dielectric layer; and a contact electrode including a first portion and a second portion above the channel layer, wherein the first portion of the contact electrode overlaps with the first portion of the channel layer, and overlaps with only the first gate dielectric layer, and the second portion of the contact electrode overlaps with the second portion of the channel layer, and overlaps with the first gate dielectric layer and the second dielectric layer.

Example 2 may include the semiconductor device of example 1 and/or some other examples herein, wherein the contact electrode is a source electrode or a drain electrode.

Example 3 may include the semiconductor device of example 1 and/or some other examples herein, wherein the second dielectric layer is above the channel layer, and the first gate dielectric layer is below the channel layer.

Example 4 may include the semiconductor device of example 1 and/or some other examples herein, wherein the second dielectric layer is above the first gate dielectric layer, and the channel layer is above the second dielectric layer.

Example 5 may include the semiconductor device of example 1 and/or some other examples herein, wherein the second dielectric layer is of a shape selected from the group consisting of rectangular shape, a square shape, an oval shape, a circular shape, a triangular shape, a staircase shape, a trapezoid shape, and a polygon shape.

Example 6 may include the semiconductor device of example 1 and/or some other examples herein, wherein the first gate dielectric material has a dielectric constant in a range of [8, 30].

Example 7 may include the semiconductor device of example 1 and/or some other examples herein, wherein the second dielectric material has a dielectric constant in a range of [2, 8).

Example 8 may include the semiconductor device of example 1 and/or some other examples herein, wherein the first gate dielectric material is a high-k material selected from the group consisting of silicon and oxygen; silicon and nitrogen; yttrium and oxygen; silicon, oxygen, and nitrogen; aluminum and oxygen; hafnium and oxygen; tantalum and oxygen; and titanium and oxygen.

Example 9 may include the semiconductor device of example 1 and/or some other examples herein, wherein the second dielectric material is a low-k material selected from the group consisting of fluorine-doped silicon dioxide, carbon-doped silicon dioxide, silicon nitride, silicon oxynitride, silicon carbon oxynitride, porous silicon dioxide, porous carbon-doped silicon dioxide, and organic polymeric dielectrics.

Example 10 may include the semiconductor device of example 1 and/or some other examples herein, wherein the channel layer includes a material selected from the group consisting of CuS$_2$, CuSe$_2$, WSe$_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, Si$_2$BN, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 11 may include the semiconductor device of example 1 and/or some other examples herein, wherein the gate electrode or the contact electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), W, Mo, Ta, and an alloy of Ti, Mo, Au, Pt, Al, Ni, Cu, Cr, TiAlN, HfAlN, or InAlO.

Example 12 may include the semiconductor device of example 1 and/or some other examples herein, wherein the substrate includes a silicon substrate, a glass substrate, a metal substrate, or a plastic substrate.

Example 13 may include the semiconductor device of example 1 and/or some other examples herein, wherein the transistor is above an interconnect that is above the substrate.

Example 14 may include a method for forming a thin film transistor (TFT), the method comprising: forming a gate electrode above a substrate; forming a first gate dielectric layer including a first gate dielectric material above the gate electrode; forming a second dielectric layer above a portion of the first gate dielectric layer, the second dielectric layer including a second dielectric material; forming a channel layer conformally covering the first gate dielectric layer and the second dielectric layer, the channel layer including a first portion and a second portion; and forming a contact electrode including a first portion and a second portion above the channel layer, wherein the first portion of the contact electrode overlaps with only the first gate dielectric layer, and the second portion of the contact electrode overlaps with the first gate dielectric layer and the second dielectric layer.

Example 15 may include the method of example 14 and/or some other examples herein, wherein the contact electrode is a source electrode or a drain electrode.

Example 16 may include the method of example 14 and/or some other examples herein, wherein the second dielectric layer is of a shape selected from the group consisting of rectangular shape, a square shape, an oval shape, a circular shape, a triangular shape, a staircase shape, a trapezoid shape, and a polygon shape.

Example 17 may include the method of example 14 and/or some other examples herein, wherein the gate electrode or the contact electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), W, Mo, Ta, and an alloy of Ti, Mo, Au, Pt, Al, Ni, Cu, Cr, TiAlN, HfAlN, or InAlO.

Example 18 may include the method of example 14 and/or some other examples herein, wherein the first gate dielectric material has a dielectric constant in a range of [8, 30].

Example 19 may include the method of example 14 and/or some other examples herein, wherein the second dielectric material has a dielectric constant in a range of [2, 8).

Example 20 may include the method of example 14 and/or some other examples herein, wherein the first gate dielectric material is a high-k material selected from the group consisting of silicon and oxygen; silicon and nitrogen; yttrium and oxygen; silicon, oxygen, and nitrogen; aluminum and oxygen; hafnium and oxygen; tantalum and oxygen; and titanium and oxygen.

Example 21 may include the method of example 14 and/or some other examples herein, wherein the second dielectric material is a low-k material selected from the group consisting of fluorine-doped silicon dioxide, carbon-doped silicon dioxide, silicon nitride, silicon oxynitride, silicon carbon oxynitride, porous silicon dioxide, porous carbon-doped silicon dioxide, and organic polymeric dielectrics.

Example 22 may include a computing device, comprising: a circuit board; and a memory device coupled to the circuit board and including a memory array, wherein the memory array includes a plurality of memory cells, a memory cell of the plurality of memory cells includes a transistor and a storage cell, and wherein the transistor includes: a gate electrode above a substrate, the gate electrode coupled to a word line of the memory array; a first gate dielectric layer including a first gate dielectric material above the gate electrode; a second dielectric layer above a portion of the first gate dielectric layer, the second dielectric layer including a second dielectric material; a channel layer including a first portion and a second portion above the gate electrode, wherein the first portion of the channel layer overlaps with only the first gate dielectric layer, and the second portion of the channel layer overlaps with the first gate dielectric layer and the second dielectric layer; a source electrode coupled to a bit line of the memory array, wherein the source electrode includes a first portion and a second portion above the channel layer, the first portion of the source electrode overlaps with the first portion of the channel layer, and overlaps with only the first gate dielectric layer, and the second portion of the source electrode overlaps with the second portion of the channel layer, and overlaps with the first gate dielectric layer and the second dielectric layer; and a drain electrode coupled to a first electrode of the storage cell; and the storage cell further includes a second electrode coupled to a source line of the memory array.

Example 23 may include computing device of example 22 and/or some other examples herein, wherein the first gate dielectric material is a high-k material selected from the group consisting of silicon and oxygen; silicon and nitrogen; yttrium and oxygen; silicon, oxygen, and nitrogen; aluminum and oxygen; hafnium and oxygen; tantalum and oxygen; and titanium and oxygen.

Example 24 may include computing device of example 22 and/or some other examples herein, wherein the second dielectric material is a low-k material selected from the group consisting of fluorine-doped silicon dioxide, carbon-doped silicon dioxide, silicon nitride, silicon oxynitride, silicon carbon oxynitride, porous silicon dioxide, porous carbon-doped silicon dioxide, and organic polymeric dielectrics.

Example 25 may include computing device of example 22 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a substrate;
   a transistor above the substrate, wherein the transistor includes:
   a gate electrode above the substrate;
   a first gate dielectric layer including a first gate dielectric material above the gate electrode;
   a second dielectric layer above a portion of the first gate dielectric layer, the second dielectric layer including a second dielectric material;
   a channel layer including a first portion and a second portion above the gate electrode, wherein the first portion of the channel layer overlaps with only the first gate dielectric layer, and the second portion of the channel layer overlaps with the first gate dielectric layer and the second dielectric layer; and
   a contact electrode including a first portion and a second portion above the channel layer, wherein the first portion of the contact electrode overlaps with the first portion of the channel layer, and overlaps with only the first gate dielectric layer, and the second portion of the contact electrode overlaps with the second portion of the channel layer, and overlaps with the first gate dielectric layer and the second dielectric layer.

2. The semiconductor device of claim 1, wherein the contact electrode is a source electrode or a drain electrode.

3. The semiconductor device of claim 1, wherein the second dielectric layer is above the channel layer, and the first gate dielectric layer is below the channel layer.

4. The semiconductor device of claim 1, wherein the second dielectric layer is above the first gate dielectric layer, and the channel layer is above the second dielectric layer.

5. The semiconductor device of claim 1, wherein the second dielectric layer is of a shape selected from the group consisting of rectangular shape, a square shape, an oval shape, a circular shape, a triangular shape, a staircase shape, a trapezoid shape, and a polygon shape.

6. The semiconductor device of claim 1, wherein the first gate dielectric material has a dielectric constant in a range of [8, 30].

7. The semiconductor device of claim 1, wherein the second dielectric material has a dielectric constant in a range of [2, 8).

8. The semiconductor device of claim 1, wherein the first gate dielectric material is a high-k material selected from the group consisting of silicon and oxygen; silicon and nitrogen; yttrium and oxygen; silicon, oxygen, and nitrogen; aluminum and oxygen; hafnium and oxygen; tantalum and oxygen; and titanium and oxygen.

9. The semiconductor device of claim 1, wherein the second dielectric material is a low-k material selected from the group consisting of fluorine-doped silicon dioxide, carbon-doped silicon dioxide, silicon nitride, silicon oxynitride, silicon carbon oxynitride, porous silicon dioxide, porous carbon-doped silicon dioxide, and organic polymeric dielectrics.

10. The semiconductor device of claim 1, wherein the channel layer includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly- III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

11. The semiconductor device of claim 1, wherein the gate electrode or the contact electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), W, Mo, Ta, and an alloy of Ti, Mo, Au, Pt, Al, Ni, Cu, Cr, TiAlN, HfAlN, or InAlO.

12. The semiconductor device of claim 1, wherein the substrate includes a silicon substrate, a glass substrate, a metal substrate, or a plastic substrate.

13. The semiconductor device of claim 1, wherein the transistor is above an interconnect that is above the substrate.

14. A computing device, comprising:
   a circuit board; and
   a memory device coupled to the circuit board and including a memory array, wherein the memory array includes a plurality of memory cells, a memory cell of the plurality of memory cells includes a transistor and a storage cell, and wherein the transistor includes:
a gate electrode above a substrate, the gate electrode coupled to a word line of the memory array;
a first gate dielectric layer including a first gate dielectric material above the gate electrode;
a second dielectric layer above a portion of the first gate dielectric layer, the second dielectric layer including a second dielectric material;
a channel layer including a first portion and a second portion above the gate electrode, wherein the first portion of the channel layer overlaps with only the first gate dielectric layer, and the second portion of the channel layer overlaps with the first gate dielectric layer and the second dielectric layer;
a source electrode coupled to a bit line of the memory array, wherein the source electrode includes a first portion and a second portion above the channel layer, the first portion of the source electrode overlaps with the first portion of the channel layer, and overlaps with only the first gate dielectric layer, and the second portion of the source electrode overlaps with the second portion of the channel layer, and overlaps with the first gate dielectric layer and the second dielectric layer; and
a drain electrode coupled to a first electrode of the storage cell; and
the storage cell further includes a second electrode coupled to a source line of the memory array.

15. The computing device of claim 14, wherein the first gate dielectric material is a high-k material selected from the group consisting of silicon and oxygen; silicon and nitrogen; yttrium and oxygen; silicon, oxygen, and nitrogen; aluminum and oxygen; hafnium and oxygen; tantalum and oxygen; and titanium and oxygen.

16. The computing device of claim 14, wherein the second dielectric material is a low-k material selected from the group consisting of fluorine-doped silicon dioxide, carbon-doped silicon dioxide, silicon nitride, silicon oxynitride, silicon carbon oxynitride, porous silicon dioxide, porous carbon-doped silicon dioxide, and organic polymeric dielectrics.

17. The computing device of claim 14, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *